(12) United States Patent
Cintora et al.

(10) Patent No.: US 8,940,996 B2
(45) Date of Patent: Jan. 27, 2015

(54) SUBSTRATE FOR PHOTOVOLTAIC CELL

(75) Inventors: Octavio Cintora, Taverny (FR); Guillaume Fourty, Paris (FR)

(73) Assignee: Saint-Gobain Glass France, Courbevoie (FR)

( * ) Notice: Subject to any disclaimer, the term of this patent is extended or adjusted under 35 U.S.C. 154(b) by 178 days.

(21) Appl. No.: 13/411,856

(22) Filed: Mar. 5, 2012

(65) Prior Publication Data

US 2012/0234368 A1  Sep. 20, 2012

(30) Foreign Application Priority Data

Mar. 9, 2011 (FR) ..................................... 11 51937

(51) Int. Cl.
*H01L 31/0392* (2006.01)
*C03C 3/087* (2006.01)

(52) U.S. Cl.
CPC ............ C03C 3/087 (2013.01); H01L 31/0392 (2013.01); *Y02E 10/50* (2013.01)
USPC ........... 136/244; 136/252; 136/262; 136/258; 136/265; 501/69; 501/70

(58) Field of Classification Search
CPC .... C03C 3/087; C03C 3/078; H01L 31/0322; H01L 31/03921; H01L 31/0392; Y02E 10/50
USPC .......................... 501/68–70, 72; 136/243–293
See application file for complete search history.

(56) References Cited

U.S. PATENT DOCUMENTS

| | | | | |
|---|---|---|---|---|
| 6,831,030 B2 * | 12/2004 | Koyama et al. | ................. | 501/70 |
| 6,844,280 B2 * | 1/2005 | Koyama et al. | ................. | 501/70 |
| 7,560,402 B2 * | 7/2009 | Thomsen et al. | ............... | 501/64 |
| 8,318,621 B2 * | 11/2012 | Sachot et al. | ................... | 501/70 |
| 2004/0209757 A1 * | 10/2004 | Landa et al. | ..................... | 501/64 |
| 2008/0163929 A1 * | 7/2008 | Krasnov | ......................... | 136/265 |
| 2009/0223252 A1 * | 9/2009 | Fulton et al. | ....................... | 65/93 |
| 2010/0101275 A1 | 4/2010 | Abensour et al. | | |
| 2010/0179048 A1 * | 7/2010 | Sachot et al. | ................... | 501/66 |
| 2010/0300535 A1 | 12/2010 | Aitken et al. | | |
| 2011/0017297 A1 | 1/2011 | Aitken et al. | | |
| 2012/0021185 A1 * | 1/2012 | Sachot et al. | ................. | 428/174 |
| 2012/0121915 A2 * | 5/2012 | Cintora et al. | ................ | 428/426 |
| 2012/0208309 A1 * | 8/2012 | Tsujimura et al. | .............. | 438/29 |

FOREIGN PATENT DOCUMENTS

| | | |
|---|---|---|
| EP | 1 281 687 | 2/2003 |
| FR | 2 764 596 | 12/1998 |
| FR | 2 765 569 | 1/1999 |
| FR | 2 911 868 | 8/2008 |
| JP | 2008-280189 | 11/2008 |
| WO | WO 2010023419 A1 * | 3/2010 |
| WO | WO 2010097538 A1 * | 9/2010 |
| WO | WO 2011049100 A1 * | 4/2011 |
| WO | WO 2011/146895 | 11/2011 |

OTHER PUBLICATIONS

U.S. Appl. No. 13/984,859, filed Aug. 12, 2013, Cintora, et al.

* cited by examiner

*Primary Examiner* — Karl Group
*Assistant Examiner* — Elizabeth A Bolden
(74) *Attorney, Agent, or Firm* — Oblon, Spivak, McClelland, Maier & Neustadt, L.L.P.

(57) ABSTRACT

The object of the invention is a substrate for photovoltaic cell comprising at least one sheet of float glass provided on a face of at least one electrode, characterized in that said glass has a chemical composition comprising the following constituents, in a weight content that varies within the limits defined below:

| | |
|---|---|
| $SiO_2$ | 69-75% |
| $Al_2O_3$ | 0-3% |
| CaO + MgO | 11-16.2% |
| MgO | 0-6.5% |
| $Na_2O$ | 9-12.4% |
| $K_2O$ | 0-1.5%. |

10 Claims, No Drawings

SUBSTRATE FOR PHOTOVOLTAIC CELL

The invention relates to the field of substrates for photovoltaic cells. It relates more specifically to substrates for photovoltaic cells comprising at least one sheet of float glass provided on a face of at least one electrode.

The use of a thin-layer photovoltaic material, typically made of CdTe or Cu(In,Ga)Se$_2$ (CIGS) makes it possible to replace expensive silicon substrates with substrates comprising sheets of glass. The material having photovoltaic properties, and generally the electrode, are deposited as a thin layer by deposition processes of the evaporation, sputtering, chemical vapor deposition (CVD) or else sublimation (CSS) type onto the glass sheet. The latter must generally be heated to high temperature, either during the deposition, or after the deposition (annealing treatment, selenization treatment, etc.), and is therefore subjected to temperatures on the order of 500° C. or more. These treatments make it possible, for example, to improve the crystallinity of the layers and therefore their electron conduction or photovoltaic properties.

The high temperatures have, however, the drawback of giving rise to a deformation of the glass sheet when it is made of standard soda-lime-silica glass.

Glasses of higher heat resistance have been proposed, but they have a high production cost, due for example to the use of expensive raw materials (barium or strontium carriers for example), or particularly high melting points. In addition, some of these glasses lend themselves poorly to the forming of the glass by the float process.

There are known for example from applications US2010/0300535 and US2011/0017297 glass compositions of aluminosilicate type having an improved resistance to the high temperatures used during the manufacture of CIS photovoltaic cells. The aluminosilicate (or borosilicate) glasses have, however, a higher propensity for scratching, a greater weight as a result of a greater density, as well as a higher refractive index, requiring the manufacturers of photovoltaic cells to modify the focalization settings of the laser during the steps of laser etching of electrodes, in particular made of molybdenum.

The objective of the invention is to overcome these drawbacks, by proposing a glass composition that has an improved thermal resistance rendering it compatible with the processes used during the manufacture of cells based on thin-layer photovoltaic materials, in particular made of CdTe or Cu(In,Ga)Se$_2$ (CIGS), additionally making it possible to produce a glass by the float process and under very favorable economic conditions.

For this purpose, one object of the invention is a substrate for a photovoltaic cell comprising at least one sheet of float glass provided on a face of at least one electrode, characterized in that said glass has a chemical composition comprising the following constituents, in a weight content that varies within the limits defined below:

| | |
|---|---|
| SiO$_2$ | 69-75% |
| Al$_2$O$_3$ | 0-3% |
| CaO + MgO | 11-16.2% |
| MgO | 0-6.5% |
| Na$_2$O | 9-12.4%, especially 9-12% |
| K$_2$O | 0-1.5%. |

While being of soda-lime-silica type, like standard glass, these compositions surprisingly make it possible to impart high thermal resistances to the glass substrates, characterized in particular by strain points at least 30° C. higher than those of standard glass.

The sum of the weight contents of SiO$_2$, Al$_2$O$_3$, CaO, MgO, Na$_2$O, K$_2$O is preferably at least 95%, in particular 98%. The content of SrO, BaO and/or ZrO$_2$ is advantageously zero in order not to penalize the cost of the glass sheet. The content of antimony and arsenic oxides also is advantageously zero because these oxides are not compatible with the float process. The other constituents of the composition may be impurities originating from the raw materials (especially iron oxide) or due to the degradation of the refractories of the melting furnace or of the refining agents (especially SO$_3$).

Silica (SiO$_2$) is the main formative element of the glass. At excessively low contents, the hydrolytic resistance of the glass, especially in a basic medium, would be too reduced. On the other hand, contents above 75% lead to a highly prejudicial increase in the viscosity of the glass. The silica content is preferably at least 70%, in particular 71% and/or at most 74%, in particular 73%.

Alumina (Al$_2$O$_3$) makes it possible to increase the hydrolytic resistance of the glass and to reduce its refractive index, the latter advantage being particularly significant when the substrate is intended to constitute the front face substrate of the photovoltaic cell. The alumina content is preferably at least 0.5%, in particular 1%, 1.5% or 2% and/or at most 2.5%.

The addition of lime (CaO) has the advantage of decreasing the high-temperature viscosity of the glass, and therefore facilitating the melting and refining thereof, while increasing the strain point, and therefore the thermal stability. The increase in the liquidus temperature and in the refractive index that can be attributed to this oxide, however, result in limiting the content thereof. Magnesia (MgO) is useful for improving the chemical durability of the glass and reducing its viscosity. High contents result, however, in intensifying the risks of devitrification. The CaO content is preferably at least 8%, or even 9% and even 10% and/or at most 13%, in particular 12%.

Soda (Na$_2$O) is useful for reducing the high-temperature viscosity and the liquidus temperature. Contents that are too high result, however, in degrading the hydrolytic resistance of the glass and its thermal stability, while increasing the cost. Potash (K$_2$O) has the same advantages and drawbacks. The Na$_2$O content is preferably at least 9.5%, in particular 10% or 11%, or even 11.5% and/or at most 12%. The K$_2$O content is preferably at most 1%, in particular 0.5%, and even 0.3%, or even 0.1%. In fact it would appear that potash significantly reduces the strain point of the glass.

According to a first preferred embodiment, the weight content of MgO is at most 1%, in particular 0.5% and even 0.1%. The CaO content is advantageously at least 11.5%, or even 12%. The Na$_2$O content is preferably at least 10%, or even 11%. It is advantageously at most 12%. Particularly preferred compositions comprise the following constituents, in a weight content that varies within the limits defined below:

| | |
|---|---|
| SiO$_2$ | 71-74.2% |
| Al$_2$O$_3$ | 0-3% |
| CaO | 11.5-13% |
| MgO | 0-1% |
| Na$_2$O | 11-12.4%, especially 11-12% |
| K$_2$O | 0-1.5%. |

According to a second preferred embodiment, the weight content of MgO is at least 4%, or even 4.5% or 5% and/or at least 6%. The CaO content is preferably between 9 and 11%, especially between 9 and 10.5%. The Na$_2$O content is advantageously at least 9.5%, or even 10% and/or at most 12% or 11%. Particularly preferred compositions comprise the following constituents, in a weight content that varies within the limits defined below:

| | |
|---|---|
| SiO$_2$ | 70-74% |
| Al$_2$O$_3$ | 0-2% |
| CaO | 9-10.5% |
| MgO | 4-6.5%, especially 4-6% |
| Na$_2$O | 10-11% |
| K$_2$O | 0-1%. |

According to a third embodiment, the weight content of CaO is at least 9%, in particular 10% and/or at most 12%, in particular 11%. The weight content of MgO is preferably at least 4% and/or at most 5%. The content of Na$_2$O is preferably at least 11%.

Particularly preferred compositions comprise the following constituents, in a weight content that varies within the limits defined below:

| | |
|---|---|
| SiO$_2$ | 69-72%, especially 69-71% |
| Al$_2$O$_3$ | 1-3%, especially 1.7-3% |
| CaO | 10-12%, especially 10.1-11% |
| MgO | 4-5% |
| Na$_2$O | 11-12.4%, especially 11.5-12% |
| K$_2$O | 0-1%, especially 0-0.3%. |

The glass may be melted in continuous furnaces, heated with the aid of electrodes and/or with the aid of overhead and/or submerged burners and/or burners positioned in the furnace crown so that the flame impacts the raw materials or the glass bath. The raw materials are generally pulverulent and comprise natural materials (sand, feldspars, limestone, dolomite, nepheline syenite, etc.) or synthetic materials (sodium carbonate or potassium carbonate, sodium sulphate, etc.). The raw materials are loaded into the furnace then undergo melting reactions in the physical sense of the term and various chemical reactions that lead to obtaining a glass bath. The molten glass is then conveyed to a forming step during which the glass sheet will take on its shape. The forming is carried out in known manner by the float process, that is to say by pouring molten glass (having a viscosity on the order of 3000 poise) onto a bath of molten tin. The strip of glass obtained is then carefully annealed in order to eliminate all thermal stresses within it, before being cut to the desired dimensions. The thickness of the glass sheet is typically between 2 and 6 mm, especially between 2.5 and 4 mm.

The electrode is preferably in the form of a thin layer deposited on the substrate (generally over the whole of one face of the substrate), directly in contact with the substrate or in contact with at least one sublayer. It may be a transparent and electrically conductive thin layer, for example based on (fluorine-doped or antimony-doped) tin oxide, on (aluminium-doped or gallium-doped) zinc oxide, or based on indium tin oxide (ITO). It may also be a thin metal layer, for example made of molybdenum. The transparent layers are generally used when the substrate is intended to form the front face substrate of the photovoltaic cell, as explained in further detail in the remainder of the text. The expression "front face" is understood to mean the face that the solar radiation passes through first.

The electrode, in thin-layer form, may be deposited on the substrate by various deposition processes, such as chemical vapor deposition (CVD) or deposition by sputtering, especially enhanced by a magnetic field (magnetron sputtering process). In the CVD process, halide or organometallic precursors are vaporized and transported by a carrier gas to the surface of the hot glass, where they decompose under the effect of the heat to form the thin layer. The advantage of the CVD process is that it is possible to use it within the process for forming the glass sheet via the float process. It is thus possible to deposit the layer at the moment when the glass sheet is on the tin bath, at the outlet of the tin bath, or else in the lehr, that is to say at the moment when the glass sheet is annealed in order to eliminate the mechanical stresses. The CVD process is particularly suitable for the deposition of layers of fluorine-doped or antimony-doped tin oxide. The sputtering process will itself preferably be used for the deposition of layers of molybdenum, of doped zinc oxide or else of ITO.

Another object of the invention is a semiconductor device comprising at least one substrate according to the invention and at least one thin layer of a material having photovoltaic properties deposited on said at least one substrate.

The material having photovoltaic properties is preferably chosen from compounds of CdTe or Cu(In,Ga)Se$_2$ (CIGS) type. The term "(In,Ga)" is understood to mean that the material may comprise In and/or Ga, in all possible content combinations: In$_{1-x}$Ga$_x$, its being possible for x to take any value from 0 to 1. In particular, x may be zero (material of CIS type). The material having photovoltaic properties may also be made of amorphous or polycrystalline silicon.

The photovoltaic material is deposited on the semiconductor device, on top of the electrode, and generally in contact with the latter. Various deposition techniques are possible, among which mention may be made, as examples, of evaporation, sputtering, chemical vapor deposition (CVD), electrolytic depositions or else sublimation (CSS). By way of example, mention may be made, in the case of layers of CIGS type, of the processes of sputtering or of electrolytic deposition (followed by a step of selenization) or co-evaporation.

An additional electrode may be deposited on (and especially in contact with) the layer of photovoltaic material. It may be a transparent and electrically conductive thin layer, for example based on (fluorine-doped or antimony-doped) tin oxide, (aluminium-doped or gallium-doped) zinc oxide, or based on indium tin oxide (ITO). It may also be a metal layer, for example made of gold or made of an alloy of nickel and aluminium. Transparent layers are generally used when the substrate is intended to form the back face substrate of the photovoltaic cell, as explained in greater detail in the remainder of the text. Buffer layers may also be inserted between the layer of photovoltaic material and the additional electrode. In the case of materials of CIGS type, it may be, for example, a layer of CdS.

Another object of the invention is a photovoltaic cell comprising a semiconductor device according to the invention. A final object of the invention is a photovoltaic module comprising a plurality of photovoltaic cells according to the invention.

Depending on the technology used, the substrate according to the invention may be the front face or back face substrate of the photovoltaic cell. By way of example, in the case of photovoltaic materials based on CIGS, the CIGS layer is generally deposited on the back face substrate (provided with its electrode, typically made of molybdenum). It is therefore the back face substrate that then has a sheet of glass having the advantageous chemical composition described previously. In the case of CdTe technology on the other hand, the photovoltaic material is often deposited on the front face substrate, so that the aforementioned chemical composition is used for the glass sheet of the front face substrate.

The photovoltaic cell is formed by bringing together the front face and back face substrates, for example by means of a lamination interlayer made of a thermosetting plastic, for example made of PVB, PU or EVA.

According to a first embodiment, the photovoltaic cell according to the invention comprises, as front face substrate, the substrate according to the invention, the chemical composition of the glass sheet of said substrate additionally comprising iron oxide in a weight content of at most 0.02%, in particular 0.015%. In this case, it is indeed important that the optical transmission of the glass be as high as possible. The sheet of glass preferably does not comprise any agent that absorbs visible or infrared radiation (especially for a wavelength between 380 and 1000 nm) other than the iron oxide (the presence of which is inevitable). In particular, the composition of the glass preferably does not contain agents chosen from the following agents, or any of the following agents: transition element oxides such as CoO, CuO, $Cr_2O_3$, $MnO_2$, rare-earth oxides such as $CeO_2$, $La_2O_3$, $Nd_2O_3$, or else coloring agents in the elemental state such as Se, Ag, Cu, Au. These agents very often have a very powerful undesirable coloring effect, which is manifested at very low contents, sometimes of around a few ppm or less (1 ppm=0.0001%). Still in order to maximize the optical transmission of the glass, the redox (defined as the ratio between the content of ferrous iron expressed in the form FeO and the total content of iron expressed in the form $Fe_2O_3$) is preferably at most 0.2, in particular 0.1. The glass sheet is preferably such that its energy transmission ($T_E$) calculated according to the standard ISO 9050:2003 is greater than or equal to 90%, in particular 90.5%, or 91% and even 91.5%, for a thickness of 3.2 mm. The front face substrate may be provided, on the face opposite that bearing the electrode, with an antireflection coating, for example made of porous silica or comprising a stack of thin layers alternating between high and low refractive index layers. Within the context of this embodiment, use is typically made of a substrate according to the invention provided with an electrode made of ITO and/or made of doped $SnO_2$, a photovoltaic material made of CdTe, an additional electrode made of gold or made of an alloy of nickel and aluminium. The back face substrate is preferably made of standard soda-lime-silica glass.

According to a second embodiment, the photovoltaic cell according to the invention comprises, as back face substrate, the substrate according to the invention, the chemical composition of the glass sheet of said substrate additionally comprising iron oxide in a weight content of at least 0.05%, in particular within a range extending from 0.08 to 2%, in particular from 0.08 to 0.2%. In the context of this embodiment, use is typically made of a substrate according to the invention provided with an electrode made of molybdenum, a photovoltaic material made of CIGS, an additional electrode made of doped ZnO. High contents of iron oxide (from 0.5 to 2%) may in this case correct the aesthetic appearance due to the presence of molybdenum. The front face substrate is preferably made of extra-clear glass, of standard soda-lime-silica composition.

The present invention will be better understood on reading the detailed description below of non-limiting exemplary embodiments.

Tables 1 and 2 below illustrate certain compositions according to the invention (Examples 1 to 8) and also a standard composition (Comparative Example C1).

Besides the chemical composition by weight, the tables indicate the following physical properties:

the strain point, referred to as S and expressed in ° C.,
the temperature at which the glass has a viscosity of 100 poise, referred to as T2 and expressed in ° C.,
the temperature at which the glass has a viscosity of 3162 poise, referred to as T3.5 and expressed in ° C.,
the forming margin, referred to as ΔT and expressed in ° C., corresponding to the difference between the temperature T3.5 and the liquidus temperature.

TABLE 1

|  | C1 | 1 | 2 | 3 | 4 |
|---|---|---|---|---|---|
| $SiO_2$ | 71.8 | 71.8 | 72.0 | 72.8 | 70.9 |
| $Al_2O_3$ | 0.6 | 1.35 | 1.3 | 0.9 | 1.8 |
| CaO | 9.5 | 9.9 | 10.0 | 9.8 | 10.0 |
| MgO | 4.0 | 5.5 | 5.6 | 5.7 | 6.2 |
| $Na_2O$ | 13.7 | 10.5 | 10.9 | 10.7 | 10.8 |
| $K_2O$ | 0 | 0.75 | 0 | 0 | 0.1 |
| $SO_3$ | 0.28 | 0.22 | 0.23 | 0.23 | 0.3 |
| S (° C.) | 510 | 537 | 542 | 538 | 547 |
| T2 (° C.) | 1421 | 1474 | 1475 | 1463 | 1467 |
| T3.5 (° C.) | 1093 | 1154 | 1155 | 1147 | 1145 |
| ΔT (° C.) | 78 | 14 | 5 | 17 | 45 |

TABLE 2

|  | 5 | 6 | 7 | 8 | 9 | 10 |
|---|---|---|---|---|---|---|
| $SiO_2$ | 73.3 | 72.2 | 73.1 | 73.4 | 71.3 | 70.1 |
| $Al_2O_3$ | 1.6 | 1.7 | 1.95 | 1.8 | 2.0 | 2.1 |
| CaO | 9.6 | 12.8 | 12.6 | 11.9 | 12.8 | 10.6 |
| MgO | 4.8 | 0.1 | 0.3 | 0.9 | 0.1 | 4.3 |
| $Na_2O$ | 10.1 | 11.8 | 11.8 | 11.6 | 11.4 | 11.8 |
| $K_2O$ | 0.38 | 1.3 | 0.06 | 0.08 | 0.4 | 0.7 |
| $SO_3$ | 0.3 | 0.3 | 0.3 | 0.3 | 0.3 | 0.3 |
| S (° C.) | 542 | 536 | 541 | 539 | 539 | 535 |
| T2 (° C.) | 1513 | 1469 | 1470 | 1482 | 1451 | 1464 |
| T3.5 (° C.) | 1166 | 1132 | 1146 | 1144 | 1133 | 1125 |
| ΔT (° C.) |  | 22 |  | 14 |  | 35 |

The compositions make it possible to obtain glasses having strain points of around 30° C. higher than that of standard glass. The result of this is a better mechanical behavior, and glass sheets that are less likely to deform during the steps of manufacturing solar cells.

These glass compositions can be produced by the float process under good conditions, as attested to by the positive forming margins. They additionally have a low propensity for scratching, a low density as well as a refractive index particularly well suited to the process for etching the electrode layer made of molybdenum.

The invention claimed is:

1. A photovoltaic cell, comprising a semiconductor device comprising:
   at least one electrode;
   a substrate, comprising at least one sheet of float glass provided on a face of the at least one electrode, wherein the float glass comprises, by weight content:
   from 69-75% of $SiO_2$;
   from 0-3% of $Al_2O_3$;
   from 11-16.2% of CaO + MgO;
   from 0-6.5% of MgO;
   from 9-12.4% of $Na_2O$;
   from 0-1.5% of $K_2O$; and
   from 0.08 to 2% of iron oxide; and
   at least one thin layer of a material having photovoltaic properties deposited on the at least one substrate, wherein the material having photovoltaic properties is a compound of Cu(In,Ga)$Se_2$ type, wherein the substrate is a back face substrate of the photovoltaic cell.

2. The photovoltaic cell of claim 1, wherein the sum of the weight contents of $SiO_2$, $Al_2O_3$, CaO, MgO, $Na_2O$, and $K_2O$ in the float glass is at least 95%.

3. The photovoltaic cell of claim 1, wherein the weight content of MgO in the float glass is at most 1%.

4. The photovoltaic cell of claim 1, wherein the float glass comprises the following constituents, by weight content:
from 71-74.2% of $SiO_2$;
from 0-3% of $Al_2O_3$;
from 11.5-13% of CaO;
from 0-1% of MgO;
from 11-12.4% of $Na_2O$; and
from 0-1.5% of $K_2O$.

5. The photovoltaic cell of claim 1, wherein the electrode is a transparent and electrically conductive thin layer comprising a fluorine-doped tin oxide, an antimony-doped tin oxide, an aluminium-doped zinc oxide, a gallium-doped zinc oxide, or an indium tin oxide.

6. The photovoltaic cell of claim 1, wherein the electrode is a thin layer made of molybdenum.

7. A photovoltaic module, comprising:
a plurality of the photovoltaic cells of claim 1.

8. The photovoltaic cell of claim 1, wherein the float glass comprises, by weight content:
from 69-72% of $SiO_2$;
from 1-3% if $Al_2O_3$;
from 10-12% of CaO;
from 4-5% of MgO;
from 11-12.4% of $Na_2O$; and
from 0-1% of $K_2O$.

9. The photovoltaic cell of claim 1 wherein the weight content of MgO in the float glass is at least 4%.

10. The photovoltaic cell of claim 1, wherein the float glass comprises, by weight content:
from 70-74% of $SiO_2$;
from 0-2% of $Al_2O_3$;
from 9-10.5% of CaO;
from 4-6% of MgO;
from 10-11% of $Na_2O$; and
from 0-1% of $K_2O$.

\* \* \* \* \*